(12) United States Patent
Ugapo

(10) Patent No.: US 11,291,300 B2
(45) Date of Patent: Apr. 5, 2022

(54) SLIDING CONTROL MOUNT ASSEMBLY

(71) Applicant: Vaiala Ugapo, Orem, UT (US)

(72) Inventor: Vaiala Ugapo, Orem, UT (US)

( * ) Notice: Subject to any disclaimer, the term of this patent is extended or adjusted under 35 U.S.C. 154(b) by 239 days.

(21) Appl. No.: 16/709,582

(22) Filed: Dec. 10, 2019

(65) Prior Publication Data

US 2021/0169216 A1    Jun. 10, 2021

(51) Int. Cl.
*A47B 21/03* (2006.01)
*H05K 7/18* (2006.01)
*F16M 13/02* (2006.01)

(52) U.S. Cl.
CPC ........... *A47B 21/03* (2013.01); *F16M 13/022* (2013.01); *H05K 7/183* (2013.01)

(58) Field of Classification Search
CPC . A47B 2013/006; A47B 17/03; A47B 17/033; A47B 2210/0062; A47B 21/03; F16M 13/022; H05K 7/183
See application file for complete search history.

(56) References Cited

U.S. PATENT DOCUMENTS

| | | | | |
|---|---|---|---|---|
| 2,755,155 | A * | 7/1956 | Luss | A47B 17/033 |
| | | | | 312/301 |
| 2,987,362 | A * | 6/1961 | Bernath | F16B 12/20 |
| | | | | 312/195 |
| 3,521,935 | A * | 7/1970 | Studinski | A47B 13/08 |
| | | | | 312/194 |
| 4,176,889 | A * | 12/1979 | Gartung | A47B 17/00 |
| | | | | 108/26 |
| 4,600,248 | A * | 7/1986 | Pflieger | A47B 17/00 |
| | | | | 312/195 |
| 4,807,764 | A * | 2/1989 | Bellin | A47B 77/10 |
| | | | | 211/118 |
| 5,316,249 | A | 5/1994 | Anderson | |
| 5,526,756 | A | 6/1996 | Watson | |
| D408,651 | S | 4/1999 | Ditonto | |
| 6,089,884 | A * | 7/2000 | Klaus | F21V 33/0012 |
| | | | | 362/648 |
| 7,207,278 | B2 | 4/2007 | Latino | |
| 9,703,278 | B2 | 7/2017 | Kristensen | |
| D825,493 | S | 8/2018 | Chen | |
| 2003/0020381 | A1* | 1/2003 | Cattaneo | A47B 21/06 |
| | | | | 312/223.6 |
| 2007/0126319 | A1* | 6/2007 | Bauer | B01L 9/02 |
| | | | | 312/209 |
| 2008/0245527 | A1 | 10/2008 | Pan | |

FOREIGN PATENT DOCUMENTS

DE        3625137 C1 * 10/1987 ........... A47B 17/003

* cited by examiner

*Primary Examiner* — Matthew W Ing

(57) ABSTRACT

A sliding control mount assembly for movably mounting a control box to an adjustable desk includes a track that is mountable on an adjustable desk having the track extending along a lateral axis of the adjustable desk. A slide is slidably insertable into the track and the slide is slidable along an entire length of the track. A control box for the adjustable desk is coupled to the slide thereby facilitating the control box to be movable along the lateral axis of the adjustable desk. In this way the slide can accommodate location preferences of a user with respect to the control box. A closure is insertable into the track to inhibit the slide from being removed from the track.

5 Claims, 5 Drawing Sheets

SLIDING CONTROL MOUNT ASSEMBLY

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

The disclosure relates to mount devices and more particularly pertains to a new mount device for movably mounting a control box to an adjustable desk.

(2) Description of Related Art Including Information Disclosed Under 37 CFR 1.97 and 1.98

The prior art relates to mount devices. The prior art includes a variety of desks with height adjustable elements. The adjustable elements range between movably supporting a computer monitor to having a vertically adjustable work surface. The prior art additionally addresses the means of connecting a control box for an adjusting mechanism to a desk. The means of connecting the control box generally refer to fixed location mounting methods.

BRIEF SUMMARY OF THE INVENTION

An embodiment of the disclosure meets the needs presented above by generally comprising a track that is mountable on an adjustable desk having the track extending along a lateral axis of the adjustable desk. A slide is slidably insertable into the track and the slide is slidable along an entire length of the track. A control box for the adjustable desk is coupled to the slide thereby facilitating the control box to be movable along the lateral axis of the adjustable desk. In this way the slide can accommodate location preferences of a user with respect to the control box. A closure is insertable into the track to inhibit the slide from being removed from the track.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
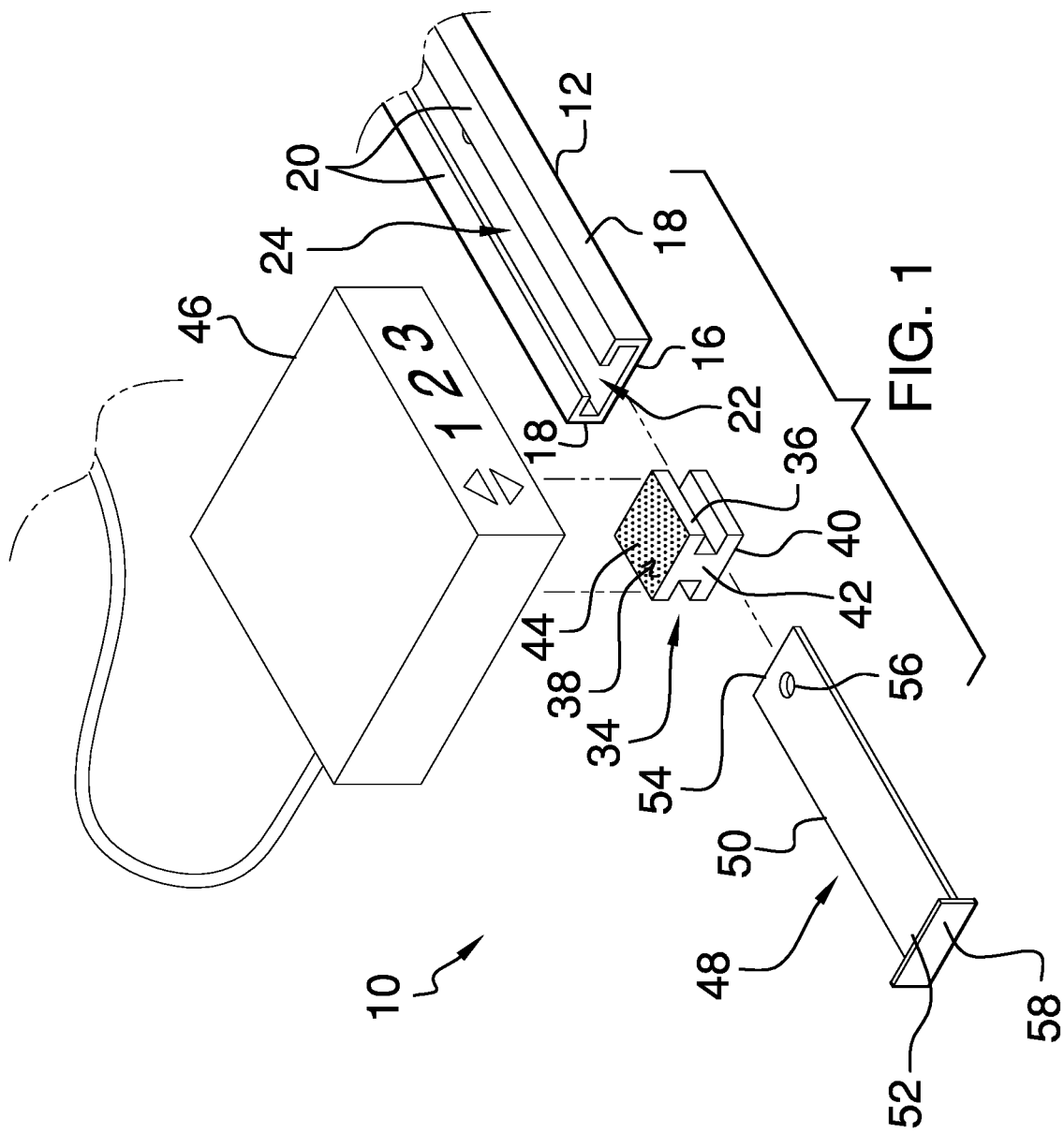
FIG. 1 is a perspective view of a sliding control mount assembly according to an embodiment of the disclosure.
Figure 2:
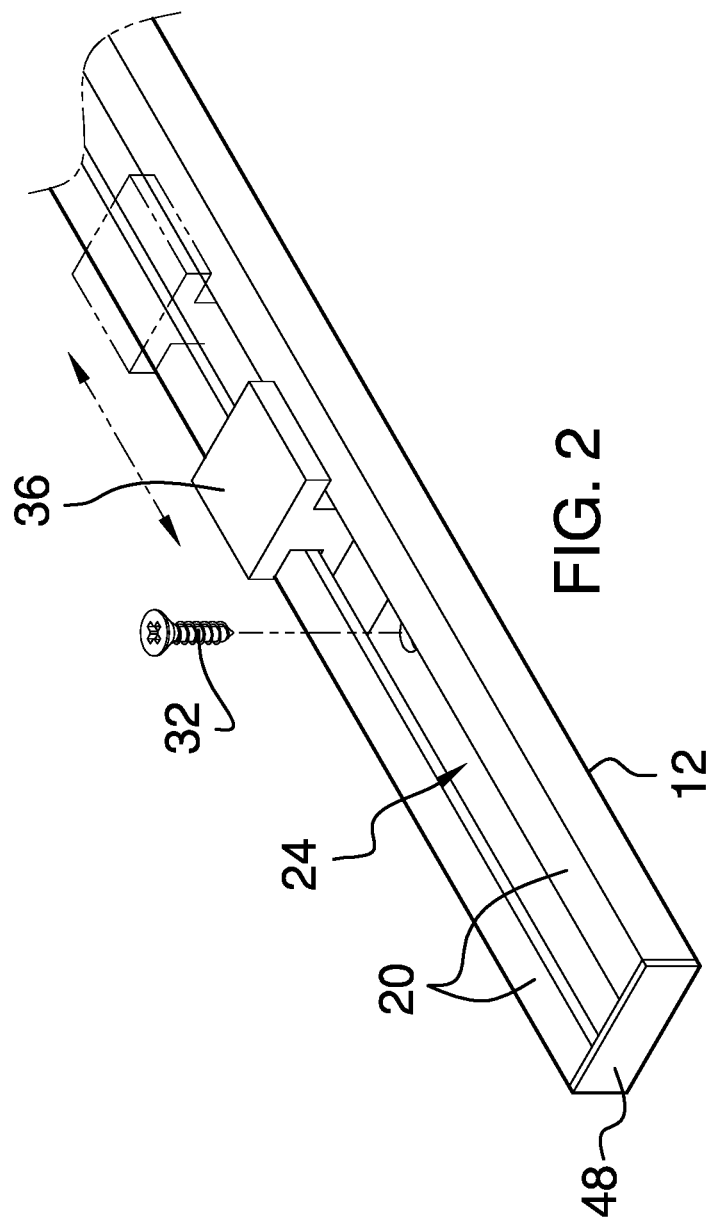
FIG. 2 is an exploded perspective view of an embodiment of the disclosure.
Figure 3:
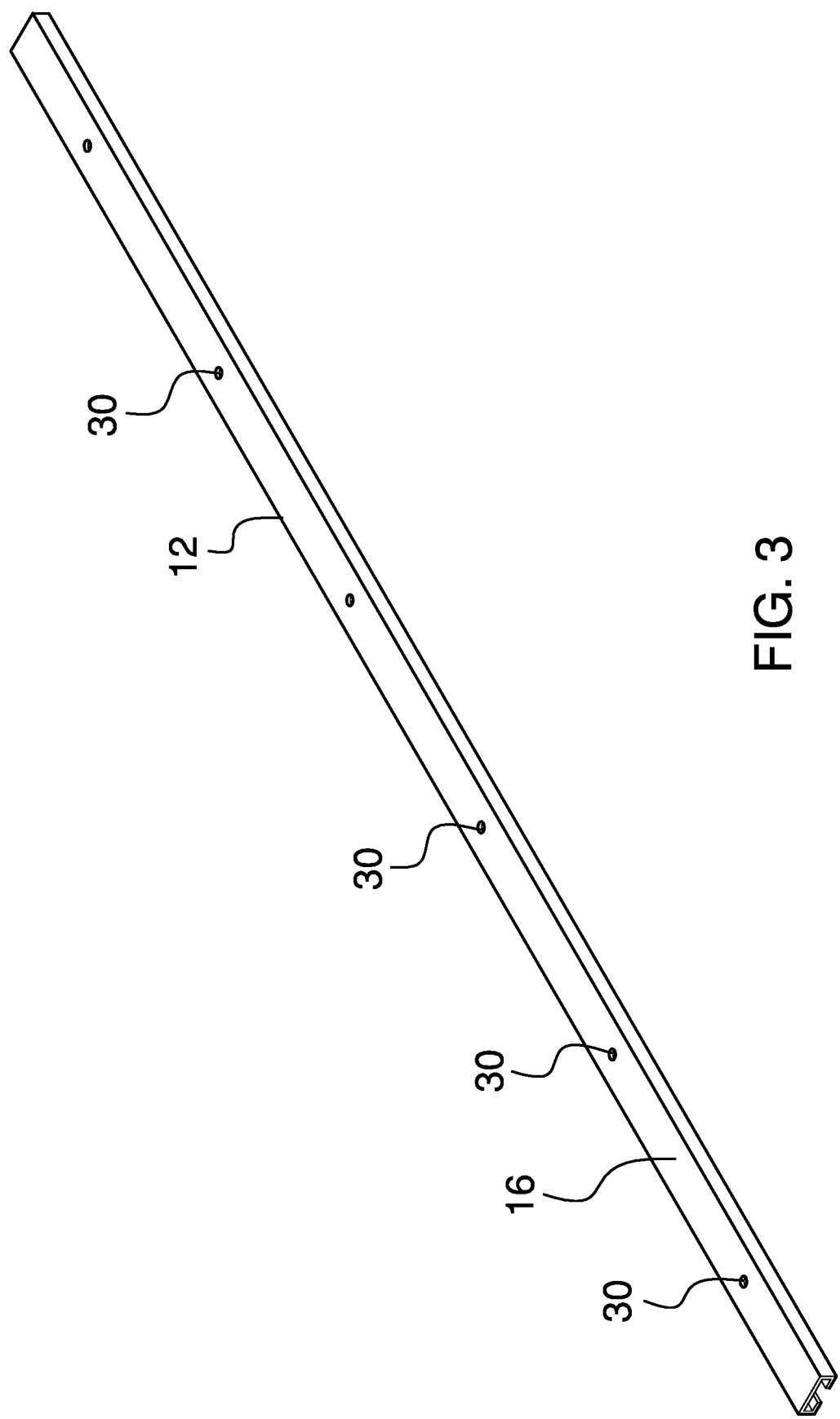
FIG. 3 is a bottom perspective view of a track of an embodiment of the disclosure.
Figure 4:
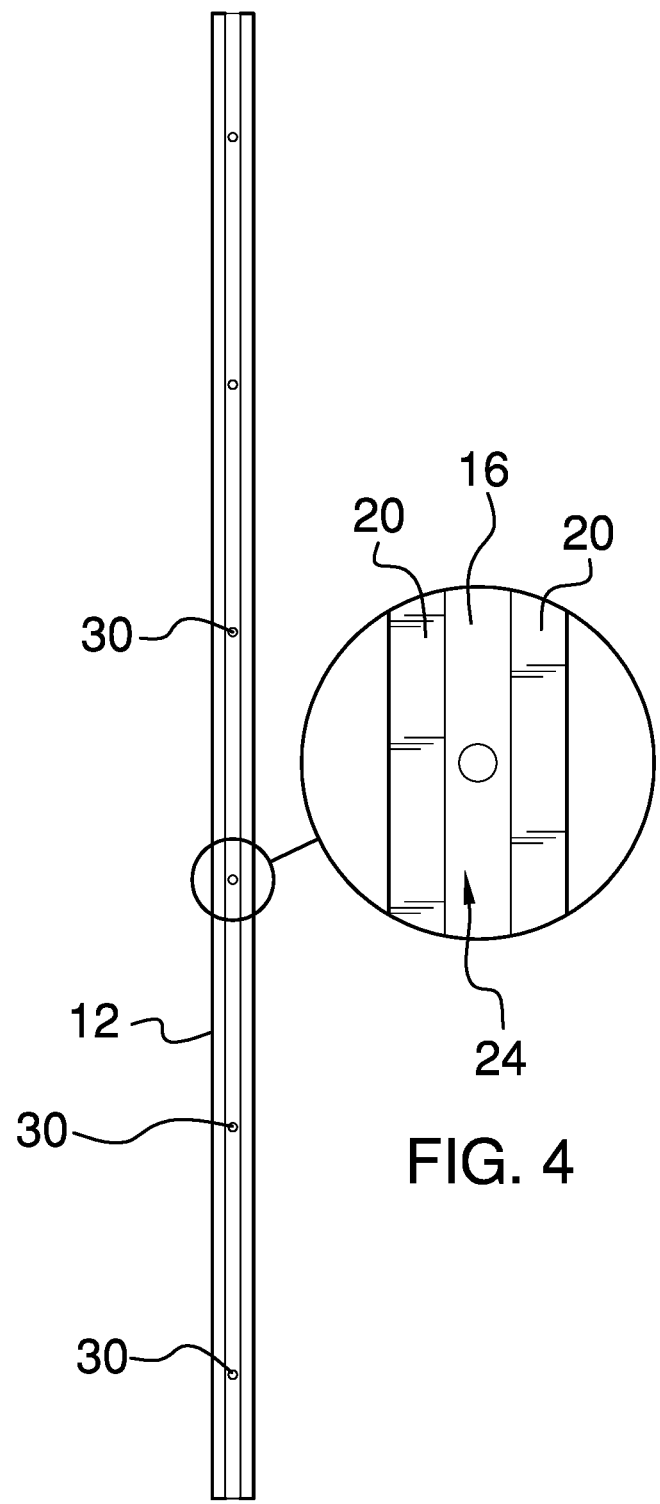
FIG. 4 is a top view of a track of an embodiment of the disclosure.
Figure 5:
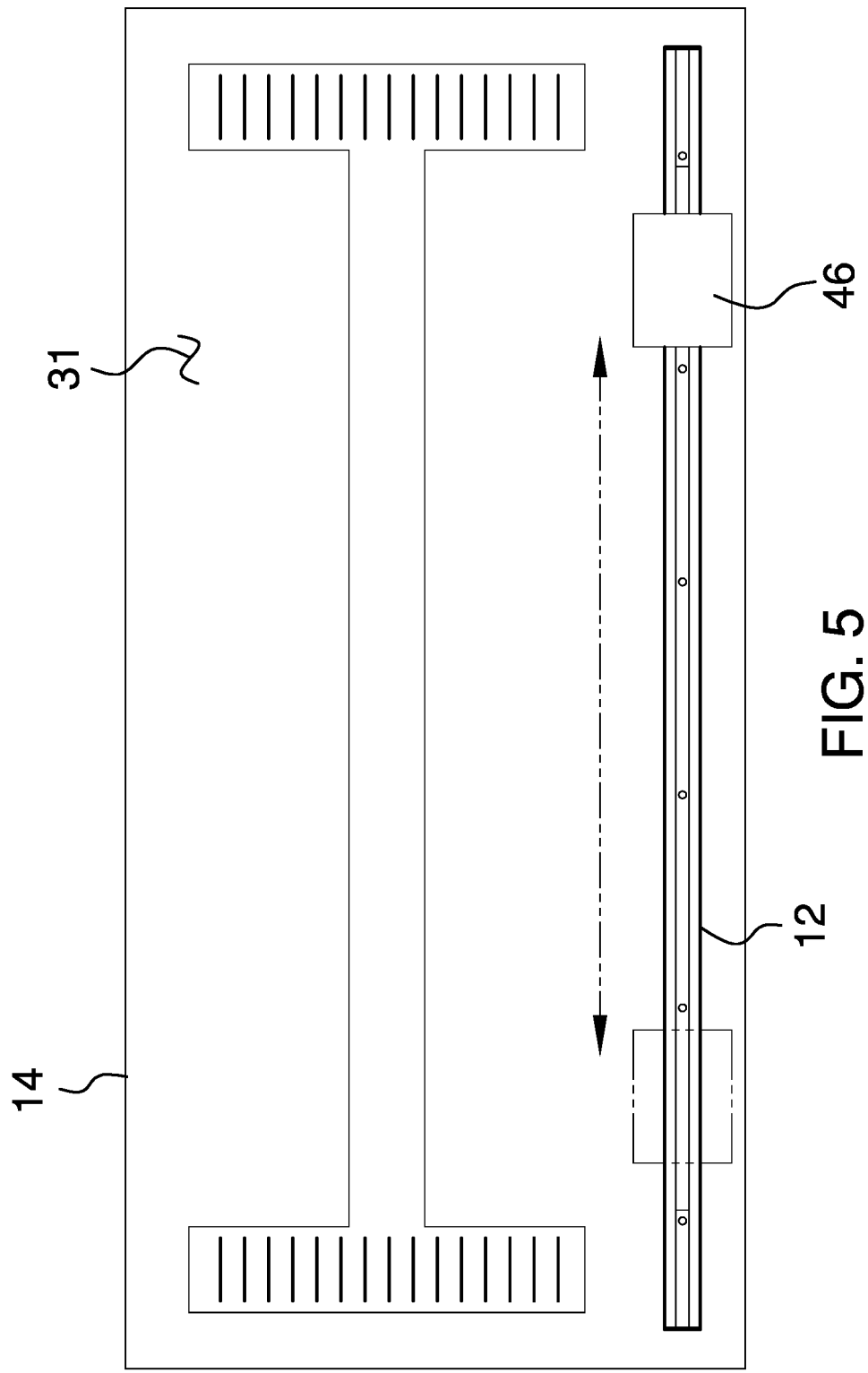
FIG. 5 is a bottom in-use view of an embodiment of the disclosure.

With reference now to the drawings, and in particular to FIGS. 1 through 5 thereof, a new mount device embodying the principles and concepts of an embodiment of the disclosure and generally designated by the reference numeral 10 will be described.

As best illustrated in FIGS. 1 through 5, the sliding control mount assembly 10 generally comprises a track 12 is mountable on an adjustable desk 14 having the track 12 extending along a lateral axis of the adjustable desk 14. The adjustable desk 14 may be a motorized standing desk or any other type of adjustable desk that has motorized components. The track 12 has a basal wall 16, a pair of lateral walls 18 each extending away from the basal wall 16 and a pair of top walls 20 each extending toward each other from a respective one of the lateral walls 18. The top walls 20 are spaced from the basal wall 16 to define a space 22 extending between the basal wall 16 and the top walls 20. Moreover, the top walls 20 are spaced apart from each other to define a slot 24 that extends into the space 22.

The track 12 is elongated between a first end 26 and a second end 28 of the track 12. Each of the space 22 and the slot 24 extends through the first end 26 and terminates at the second end 28 such that the second end 28 is closed. The basal wall 16 has a plurality of fastener openings 30 extending therethrough. The fastener openings 30 are spaced apart from each other and are distributed between the first end 26 and the second end 28. The basal wall 16 of the track 12 abuts a bottom surface 31 of the adjustable desk 14. Moreover, the track 12 is aligned with a forward edge of the adjustable desk 14 such that the track 12 is accessible to a user of the adjustable desk 14. A plurality of fasteners 32 is each extendable through a respective one of the fastener openings 30 and engages the adjustable desk 14 for fastening the track 12 to the adjustable desk 14.

A slide 34 is provided and the slide 34 is slidably insertable into the track 12. The slide 34 is slidable along an entire length of the track 12. The slide 34 comprises a first panel 36 has a first surface 38, a second panel 40 and a stem 42 that extends between the first panel 36 and the second panel 40. The second panel 40 is insertable into the space 22 in the track 12 having the stem 42 extending outwardly through the slot 24 in the track 12. Moreover, the first panel 36 is positioned outside of the track 12 having the first surface 38 being exposed. The second panel 40 is insertable into the first end 26 of the track 12.

The slide 34 includes a mating member 44 that is coupled to the first surface 38 of the first panel 36. The mating member 44 engages a control box 46 for the adjustable desk 14 such that the control box 46 is slidably retained on the bottom surface 31 of the adjustable desk 14. In this way the control box 46 can be positioned at a variety of locations on the adjustable desk 14. The mating member 44 may comprise an adhesive layer, a hook and loop fastener or other type of releasable engagement.

A closure 48 is provided and the closure 48 is insertable into the first end 26 of the track 12 to inhibit the slide 34 from being removed from the track 12. The closure 48 comprises a slide panel 50 that has a primary end 52 and a secondary end 54. The slide panel 50 is elongated between the primary end 52 and the secondary end 54, and the slide panel 50 has an opening 56 extending therethrough. The slide panel 50 is insertable into the first end 26 of the track 12 having the opening 56 being aligned with a respective one of the fastener openings 30 in the basal wall 16 of the track 12. The slide 34 extends into the space 22 in the track 12 when the closure 48 is inserted into the first end 26.

The closure 48 includes a cap 58 that is coupled to the primary end 52 of the slide panel 50. The cap 58 has dimensions that match the dimensions of the first end 26 of the track 12. The cap 58 abuts the first end 26 and closes the first end 26 when the slide 34 is fully inserted into the space 22 in the track 12.

In use, the track 12 is mounted to the bottom surface 31 of the adjustable desk 14 having the track 12 being oriented to extend laterally across the adjustable desk 14. The slide 34 is inserted into the track 12 and the closure 48 is inserted into the track 12. The control box 46 is positioned against the mating member 44 for attaching the control box 46 to the slide 34. In this way the control box 46 can be positioned anywhere along the length of the track 12. Thus, the user of the adjustable desk 14 can position the control box 46 at a location that works best for their preference.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A sliding control mount assembly comprising:
   a track being mountable on an adjustable desk having said track extending along a lateral axis of the adjustable desk, wherein said track has a basal wall, a pair of lateral walls each extending away from said basal wall and a pair of top wall each extending toward each other from a respective one of said lateral walls, said top walls being spaced from said basal wall to define a space extending between said basal wall and said top walls, said top walls being spaced apart from each other to define a slot extending into said space, said track being elongated between a first end and a second end of said track, each of said space and said slot extending through said first end and terminating, at said second end such that said second end is closed;
   wherein said basal wall has a plurality of fastener openings extending therethrough, said fastener openings being spaced apart from each other and being distributed between said first end and said second end, said basal wall of said track abutting a bottom surface of the adjustable desk, said track being aligned with a forward edge of the adjustable desk wherein said track is configured to be accessible to a user of the adjustable desk;
   a slide being slidably insertable into said track, said slide being slidable along an entire length of said track, said slide having a control box for the adjustable desk being coupled thereto thereby facilitating the control box to be movable along the lateral axis of the adjustable desk wherein said slide is configured to accommodate location preferences of a user with respect to the control box, said slide comprising
      a first panel having a first surface,
      a second panel, wherein said second panel is insertable into said space in said track having said stem extending outwardly through said slot in said track such that said first panel is positioned outside of said track having said first surface being exposed, said second panel being insertable into said first end of said track, and
      a stem extending between said first panel and said second panel; and
   a closure being insertable into said track to inhibit said slide from being removed from said track, wherein said closure comprises a slide panel having a primary end and a secondary end, said slide panel being elongated between said primary end and said secondary end, said slide panel having an opening extending therethrough, said slide panel being insertable into first end of said track having said opening being aligned with a respective one of said fastener openings in said basal wall of said track, said slide extending into said space in said track.

2. The assembly according to claim 1, further comprising a plurality of fasteners, each of said fasteners being extendable through a respective one of said fastener openings and engaging the adjustable desk for fastening said track to the adjustable desk.

3. The assembly according to claim 1, wherein said slide includes a mating member being coupled to said first surface of said first panel, said mating member engaging a control box for the adjustable desk such that said control box is slidably retained on the bottom surface of the adjustable desk wherein said control box is configured to be positioned at a variety of locations on the adjustable desk.

4. The assembly according to claim 1, wherein said closure includes a cap being coupled to said primary end of said slide panel, said cap having dimensions that match the dimensions of said first end of said track, said cap abutting said first end and closing said first end when said slide is fully inserted into said space in said track.

5. A sliding control mount assembly comprising:

a track being mountable on an adjustable desk having said track extending along a lateral axis of the adjustable desk, said track having a basal wall, a pair of lateral walls each extending away from said basal wall and a pair of top wall each extending toward each other from a respective one of said lateral walls, said top walls being spaced from said basal wall to define a space extending between said basal wall and said top walls, said top walls being spaced apart from each other to define a slot extending into said space, said track being elongated between a first end and a second end of said track, each of said space and said slot extending through said first end and terminating at said second end such that said second end is closed, said basal wall having a plurality of fastener openings extending therethrough, said fastener openings being spaced apart from each other and being distributed between said first end and said second end, said basal wall of said track abutting a bottom surface of the adjustable desk, said track being aligned with a forward edge of the adjustable desk wherein said track is configured to be accessible to a user of the adjustable desk;

a plurality of fasteners, each of said fasteners being extendable through a respective one of said fastener openings and engaging the adjustable desk for fastening said track to the adjustable desk;

a slide being slidably insertable into said track, said slide being slidable along an entire length of said track, said slide comprising:

a first panel having a first surface;

a second panel;

a stem extending between said first panel and said second panel, said second panel being insertable into said space in said track having said stem extending outwardly through said slot in said track such that said first panel is positioned outside of said track having said first surface being exposed, said second panel being insertable into said first end of said track; and an mating member being coupled to said first surface of said first panel, said mating member engaging a control box for the adjustable desk such that said control box is slidably retained on the bottom surface of the adjustable desk wherein said control box is configured to be positioned at a variety of locations on the adjustable desk; and a closure being insertable into said first end of said track to inhibit said slide from being removed from said track, said closure comprising:

a slide panel having a primary end and a secondary end, said slide panel being elongated between said primary end and said secondary end, said slide panel having an opening extending therethrough, said slide panel being insertable into first end of said track having said opening being aligned with a respective one of said fastener openings in said basal wall of said track, said slide extending into said space in said track; and a cap being coupled to said primary end of said slide panel, said cap having dimensions that match the dimensions of said first end of said track, said cap abutting said first end and closing said first end when said slide is fully inserted into said space in said track.

* * * * *